United States Patent
Zhuo et al.

(10) Patent No.: US 12,176,928 B2
(45) Date of Patent: Dec. 24, 2024

(54) VCD VECTOR COMPRESSION METHOD AND DEVICE BASED ON CIRCUIT TOGGLE BEHAVIORS

(71) Applicant: ZHEJIANG UNIVERSITY, Zhejiang (CN)

(72) Inventors: Cheng Zhuo, Zhejiang (CN); Yufei Chen, Zhejiang (CN)

(73) Assignee: ZHEJIANG UNIVERSITY, Zhejiang (CN)

( * ) Notice: Subject to any disclaimer, the term of this patent is extended or adjusted under 35 U.S.C. 154(b) by 0 days.

(21) Appl. No.: 18/271,476

(22) PCT Filed: Mar. 22, 2023

(86) PCT No.: PCT/CN2023/083013
§ 371 (c)(1),
(2) Date: Jul. 10, 2023

(87) PCT Pub. No.: WO2023/207440
PCT Pub. Date: Nov. 2, 2023

(65) Prior Publication Data
US 2024/0396570 A1    Nov. 28, 2024

(30) Foreign Application Priority Data

Apr. 24, 2022   (CN) .......................... 202210435940.8

(51) Int. Cl.
*H03M 7/30*    (2006.01)

(52) U.S. Cl.
CPC ....... *H03M 7/3082* (2013.01); *H03M 7/3064* (2013.01); *H03M 7/6011* (2013.01)

(58) Field of Classification Search
CPC .......................... H03M 7/3082; H03M 7/6011
(Continued)

(56) References Cited

U.S. PATENT DOCUMENTS

| | | | |
|---|---|---|---|
| 2009/0206868 A1 | 8/2009 | Laisne et al. | |
| 2009/0276738 A1* | 11/2009 | Jain ...................... | G06F 30/3308 716/106 |
| 2018/0189374 A1* | 7/2018 | Mittal ................. | G06F 16/2477 |

FOREIGN PATENT DOCUMENTS

| | | |
|---|---|---|
| CN | 109740214 | 5/2019 |
| CN | 112287626 | 1/2021 |

(Continued)

OTHER PUBLICATIONS

"International Search Report (Form PCT/ISA/210) of PCT/CN2023/083013," mailed on May 22, 2023, pp. 1-3.
(Continued)

*Primary Examiner* — Peguy Jean Pierre
(74) *Attorney, Agent, or Firm* — JCIPRNET

(57) ABSTRACT

Disclosed are a VCD vector compression method and device based on circuit toggle behaviors. The method comprises: converting a VCD format file into a current matrix model, wherein three dimensions of the current matrix model are one time dimension and two spatial dimensions; performing preliminary screening based on an overall toggle feature: dividing the current matrix into several time segments in accordance with an equal interval in the time dimension, and performing screening according to the overall toggle feature, and forming a preliminary screened current distribution matrix by the screened time segments; performing fine screening based on region toggle features: performing further screening according to local toggle features, and forming a fine screened current distribution matrix by the screened time segments; and re-outputting the fine screened current distribution matrix as a VCD format file after vector compression.

10 Claims, 6 Drawing Sheets

(58) Field of Classification Search
USPC .................................... 341/50, 51, 106, 87
See application file for complete search history.

(56) References Cited

FOREIGN PATENT DOCUMENTS

| | | |
|---|---|---|
| CN | 112398488 | 2/2021 |
| CN | 112560374 | 3/2021 |
| CN | 114818598 | 7/2022 |

OTHER PUBLICATIONS

"Written Opinion of the International Searching Authority (Form PCT/ISA/237) of PCT/CN2023/083013," mailed on May 22, 2023, with English translation thereof, pp. 1-10.

* cited by examiner

VCD VECTOR COMPRESSION METHOD AND DEVICE BASED ON CIRCUIT TOGGLE BEHAVIORS

CROSS-REFERENCE TO RELATED APPLICATION

This application is a 371 of international application of PCT application serial no. PCT/CN2023/083013, filed on Mar. 22, 2023, which claims the priority benefit of China application no. 202210435940.8, filed on Apr. 24, 2022. The entirety of each of the above mentioned patent applications is hereby incorporated by reference herein and made a part of this specification.

FIELD OF TECHNOLOGY

The present invention relates to circuit verification, power supply integrity analysis, circuit power consumption analysis and other engineering technical fields, and in particular to a Value Change Dump (VCD) vector compression method and device based on circuit flipping behaviors which are used for transient simulation power consumption analysis of circuits.

BACKGROUND TECHNOLOGY

With development of very large scale integrated circuit technology, a chip operating voltage is lower and lower, but current density is higher and higher. This results in lower and lower noise tolerance of a system, which puts higher requirements on stability of a power system in the entire operating frequency band. Power integrity has increasingly important impact on system reliability, signal-to-noise ratio, bit error rate, electromagnetic interference/electromagnetic compatibility (EMI/EMC) and other important indexes in circuit design. Therefore, integrated circuit design of advanced technologies usually has very strict indexes of power integrity to ensure stability of a circuit.

On-chip power distribution needs to ensure that the circuit is robust, which means that it not only needs to meet average power/current requirements, but also needs to ensure that timing or reliability is not affected by dynamic IR drop caused by local power demand and switching modes. Static IR analysis is used for average IR Drop of a power grid. Unlike the static IR Drop analysis, dynamic IR analysis of the circuit targets a toggle behavior of the circuit, and the results are highly correlated with an input vector. In addition, the dynamic IR Drop depends on timing of logical switching and is not affected by a clock cycle like in the static IR Drop. For example, in FIG. 1, average current of the same dynamic toggle current under different clock cycles, that is, the results of static IR Drop would also differ greatly.

Although an existing simulation software also supports dynamic IR simulation without a vector, dynamic IR simulation driven by VCD is closer to an actual running state of the circuit, and is more helpful to find a design defect in an actual scenario. However, a VCD file records the toggle behavior of the entire circuit during the simulation, and its scale is generally very large, and the simulation software is difficult to analyze the entire VCD. Meanwhile, worst-case dynamic IR information would not appear at most of the moments recorded in the VCD file, and it is not necessary to simulate these fragments when performing the dynamic simulation. Therefore, it is very necessary to select key fragments in VCD for the simulation.

However, as far as we know, there is no open source and mature VCD fragment screening technology. Designers rely more on their own experience to screen VCD fragments, and there is no unified standard, which requires us to develop an accurate VCD fragment screening technology to speed up the dynamic IR simulation, so as to reduce verification time of chip design.

In summary, a VCD vector compression method based on circuit toggle behaviors is provided to shorten a length of transient simulation excitation vector, which is the key to improve a simulation speed and shorten a design cycle.

SUMMARY OF THE INVENTION

In view of a transient simulation speed problem of VCD vector excitation in current power supply integrity analysis, the present invention aims to provide a VCD vector compression method and device based on circuit toggle behaviors. In a power supply integrity test, the method can compress a VCD vector quickly and without affecting simulation results, and obtain power supply integrity simulation results by using a compressed VCD vector.

The purpose of the present invention is realized through the following technical scheme: in a first aspect, provided in the present invention is a VCD vector compression method based on circuit toggle behaviors, the method comprising the following steps:

(1) converting a VCD format file into a three-dimensional current matrix, wherein three dimensions of a current matrix model are one time dimension and two spatial dimensions;

(2) performing preliminary screening based on an overall toggle feature: according to the current matrix obtained in step (1), dividing the current matrix into several time segments in accordance with an equal interval in the time dimension, and performing screening according to the overall toggle feature, and forming a preliminary screened current distribution matrix by the screened time segments;

(3) performing fine screening based on region toggle features: according to the preliminary screened current distribution matrix, re-dividing the preliminary screened current distribution matrix into several time segments in accordance with an equal interval in the time dimension, and performing further screening according to local toggle features, and forming a fine screened current distribution matrix by the screened time segments, wherein the local toggle features are obtained by dividing the preliminary screened current distribution matrix into several sub-regions according to element positions, and calculating a toggle rate of each sub-region and interactive influence among different sub-regions; and (4) re-outputting the fine screened current distribution matrix of step (3) as a VCD format file after vector compression.

Further, in step (1), a specific process of converting a VCD format file into a three-dimensional current matrix model is as follows: corresponding a toggle recorded in the VCD file to a pin of a specific device, and then obtaining a device position through a Design Exchange Format (DEF) file to locate the toggle to a specific position, which corresponds to the two spatial dimensions of the current matrix; and determining initial time according to toggle timing recorded in the VCD file, and determining a specific current changes with time according to a mapping from the toggle to current, which corresponds to the time dimension of the current matrix.

Further, the mapping from the toggle to the current is a toggle waveform recorded in an Apache Power Libraries (APL) format file, or a current estimated from power consumption in a liberty (lib) file.

Further, in step (1), converting a device toggle vector recorded in the VCD format file into a three-dimensional current distribution matrix; and recording the toggle behaviors in a matrix form to generate a sparse matrix, and recording the three-dimensional sparse matrix in a dictionary form.

Further, step (2) is specifically as follows: for the current matrix model obtained in step (1), obtaining the toggle rate of each time segment according to the following formula:

$$\text{ToggleRate} = \frac{N_{total}}{\tau}$$

wherein $\tau$ is the length of the time segment, and $N_{total}$ is a total number of toggles of the element during this period; and setting a preliminary screening threshold $\theta_c$, retaining a segment with a toggle rate higher than $\theta_c$, and removing a segment with a toggle rate lower than a threshold.

Further, in step (2), the overall toggle feature is obtained by calculating a toggle rate of a circuit element within each time segment and screening out a time segment with a toggle rate larger than a preliminary screening threshold.

Further, a specific process of calculating interactive influence among different sub-regions is as follows: determining a parallel relationship for response sub-regions of the same toggle excitation; assuming that a lowest metal layer is horizontally arranged and a second metal layer from the lowest metal layer is vertically arranged, determining a ratio of response current thereof as follows:

$$\frac{I_{s,a}}{I_{s,b}} = \frac{R_{s,b}}{R_{s,a}} = \frac{d_{1,a} + \alpha \cdot d_{1,b}}{d_{2,a} + \alpha \cdot d_{2,b}}$$

wherein, $I_{s,a}$ and $I_{s,b}$ represent response currents of an excitation of the sub-region s in the sub-region a and sub-region b; $R_{s,a}$ and $R_{s,b}$ represent resistance from the sub-region s to the sub-region a and sub-region b respectively; a horizontal distance from the sub-region s to the sub-region a is $d_{1,a}$, a longitudinal distance is $d_{2,a}$; a horizontal distance from the sub-region s to the sub-region b is $d_{1,b}$, a longitudinal distance is $d_{2,b}$; and a ratio of resistivity of the lowest metal layer to the second metal layer from the lowest metal layer is a; and taking influence of the toggle on the sub-region where the toggle is located as a normalization standard, that is, assuming that $I_{s,s}$ is 1, calculating ratios among all the sub-regions so as to obtain the interactive influence among different sub-regions;

a specific process of performing time segment screening is as follows: calculating a response of the sub-region a to the toggle region according to the toggle rate $T_s$ of the sub-region s, and determining a corresponding screening criteria as follows:

$$\max_{a \in D}\left(\sum_{s \in S}(I_{s,a} \cdot T_s)\right) > \theta_f$$

wherein $I_{s,a}$ represents a response current of the excitation of the sub-region s in the sub-region a; D represents all the sub-regions that need to be calculated, and S represents all the sub-regions that have the toggles at the current moment, $\theta_f$ represents a set fine screening threshold; and, as long as a maximum response value of the sub-region within the time segment is greater than the fine screening threshold, the time segment is retained, otherwise the time segment is removed.

Further, step (4) is specifically as follows: when the fine screened current distribution matrixes of step (3) are spliced into a new VCD file, determining that the length of each time segment should be above 10% of the length of the time segment used in screening, so as to avoid the influence of tailing of a previous time segment on simulation results; and when generating the new VCD file, making up header information, mapping information from a VCD node name to a design name, and initial value information in the original VCD file.

In a second aspect, provided in the present invention is a VCD vector compression device based on circuit toggle behaviors, the VCD vector compression device comprising a memory stored with an executable code, and one or more processors, wherein the processor executes the executable code in order to fulfill the steps of the VCD vector compression method based on the circuit toggle behaviors.

In a third aspect, further provided in the present invention is a computer readable storage medium configured for storing one or more computer programs, wherein the one or more computer programs include a program code, the program code, when the computer program is run on a computer, is used for performing the VCD vector compression method based on the circuit toggle behaviors.

DESCRIPTION OF THE EMBODIMENTS

The present invention is further explained in detail in combination with drawings and specific embodiments.

Figure 1:
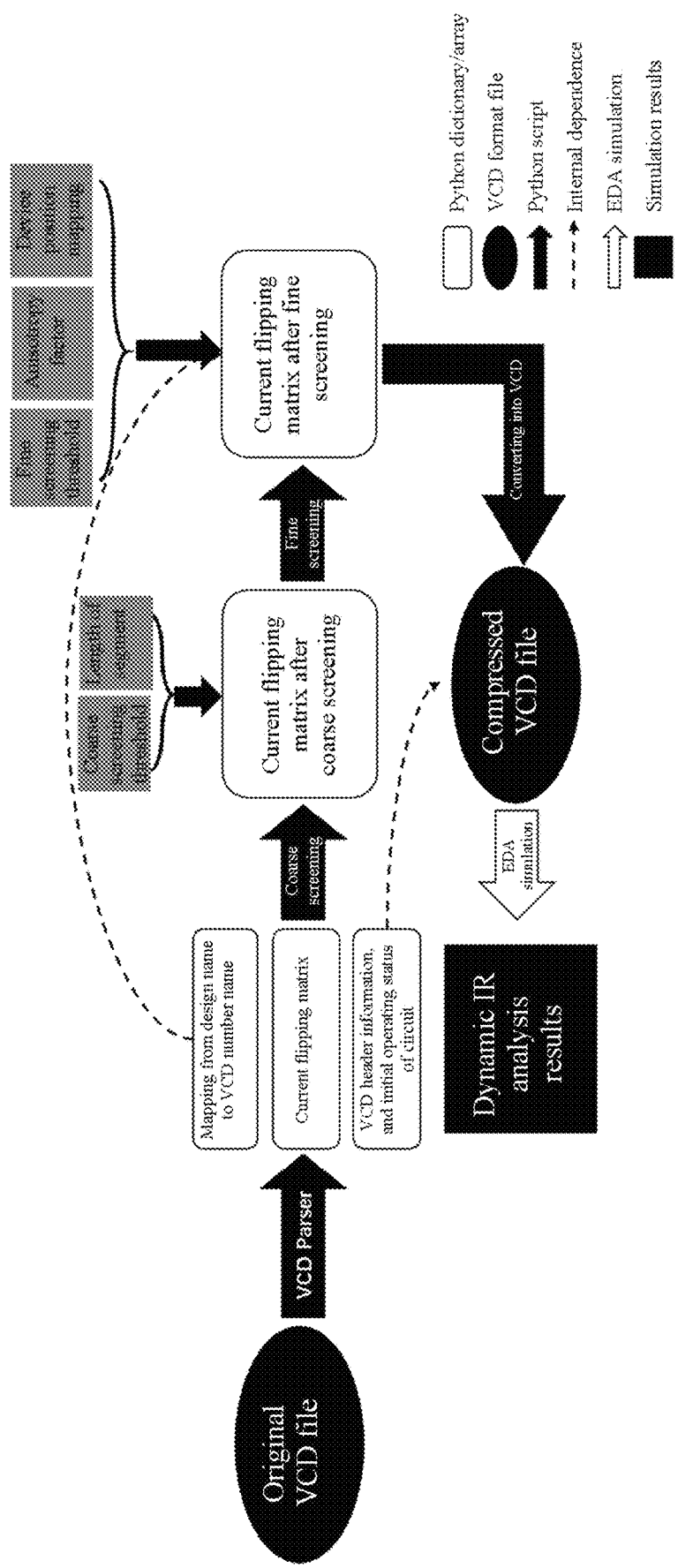
FIG. 1 is a flow schematic diagram of a VCD vector compression method based on circuit toggle behaviors in the present invention.

As shown in FIG. 1, a VCD vector compression method based on circuit toggle behaviors in the present invention comprises the following modules:

(1) VCD File Reading and Conversion

Converting a VCD format file into a three-dimensional current matrix, wherein three dimensions of a current matrix model are one time dimension and two spatial dimensions, and this step is used to read a VCD file and convert it into a three-dimensional current distribution matrix model.

Specifically, the VCD file can be divided into four parts: a header information part, a name mapping part, a circuit initial value assignment part and a toggle value recording part.

The header information part records information such as a version, a tool and time scale when the VCD is generated. The time scale controls how long of specific time each timestamp represents and is important information for mapping the toggle to actual time.

In order to compress a file length, the VCD maps a design name to a sequential ascii code name, and the name mapping part records a correspondence relationship between the design name and the ascii code name. This part of the information associates the toggle with an actual physical location and is important for mapping the toggle to the actual location.

By assigning the initial value of the circuit and recording every toggle of each element of the circuit, the VCD file describes the entire toggle behaviors of the circuit in detail. The circuit initial value assignment part and the toggle value recording part record the toggle behaviors of the circuit in the whole simulation time, which is a main part of the VCD file. For each element, its state at each moment can be read from the VCD file, so an input to the power consumption simulation can be determined through the VCD file, wherein the input is the circuit behavior recorded in the VCD and is also known as the VCD vector. Generally, the VCD vector has three dimensions, which are a time dimension for recording the behaviors of the element at different simulation timings and two spatial dimensions for corresponding to coordinates of the element in an actual design.

With respect to reading the VCD file, firstly, it needs to read the time scale in the head information to determine the length of the time segment; then it needs to record the mapping information, which is recorded by the VCD in the name mapping part, from the element ascii name to the physical design name, so that each toggle can be mapped to a specific location; and finally, a current change matrix is obtained by combining the initial value with the toggle information. Since a toggle interval of an element in the VCD file is much larger than a recording interval, recording the toggle behaviors directly in a matrix form produces a very sparse matrix. In order to reduce storage amount, in the present invention, the three-dimensional sparse matrix is recorded in a dictionary form of {instance: [(time$_1$,value$_1$), (time$_2$, value$_2$) . . . (time$_n$, value$_n$)]}.

Instance represents a name of the device and is also a key of the dictionary, and (time$_1$,value$_1$) indicates timing of a certain toggle and a corresponding toggle value.

(2) Preliminary Screening Based on an Overall Toggle Feature

According to the current matrix obtained in step (1), dividing the current matrix into several time segments in accordance with an equal interval in the time dimension, and performing screening according to the overall toggle feature, and forming a preliminary screened current distribution matrix by the screened time segments, wherein this step is used for the preliminary screening of the extracted current distribution matrix.

Specifically, resistance in a power supply network is a root cause of IR Drop in a power supply, and a higher toggle rate corresponds to a larger current of the power supply required, and the larger current of the power supply would lead to more serious IR Drop. Therefore, there is a positive correlation relationship between the toggle rate and the IR Drop, and the toggle rate can be used as a feature to screen effective VCD fragments. The toggle rate of each fragment is obtained according to the following formula:

$$\text{ToggleRate} = \frac{N_{total}}{\tau}$$

Wherein $\tau$ is the length of the time segment, and $N_{total}$ is a total number of toggles of the element during this period.

Setting a preliminary screening threshold $\theta_c$, comparing the toggle rates for all time segments, retaining a segment with a toggle rate higher than $\theta_c$, and removing a segment with a toggle rate lower than a threshold.

Meanwhile, this method is easy to implement and in practice can be done in the same scanning of the VCD file at the same time as the format conversion in step (1). During the format conversion, the toggle rate of the moment of conversion can be calculated at the same time. If the toggle rate is lower than the threshold, the segment is discarded. By controlling the preliminary screening threshold $\theta_c$, a compression ratio of the preliminary screening module can be easily adjusted. Generally, the preliminary screening threshold $\theta_c$ can be selected as 40% to 60% of a maximum toggle rate.

(3) Fine Screening Based on Region Toggle Features

According to the preliminary screened current distribution matrix, re-dividing the preliminary screened current distribution matrix into several time segments in accordance with an equal interval in the time dimension, and performing further screening according to local toggle features, and forming a fine screened current distribution matrix by the screened time segments, wherein the local toggle features are obtained by dividing the preliminary screened current distribution matrix into several sub-regions according to conditions such as a position of the device and its dependent function region, and then calculating the toggle rate of each sub-region and interactive influence among different sub-regions. This module is used to measure difference of the toggle distribution by using the local toggle features, so as to screen the current distribution matrix more carefully.

Figure 2:
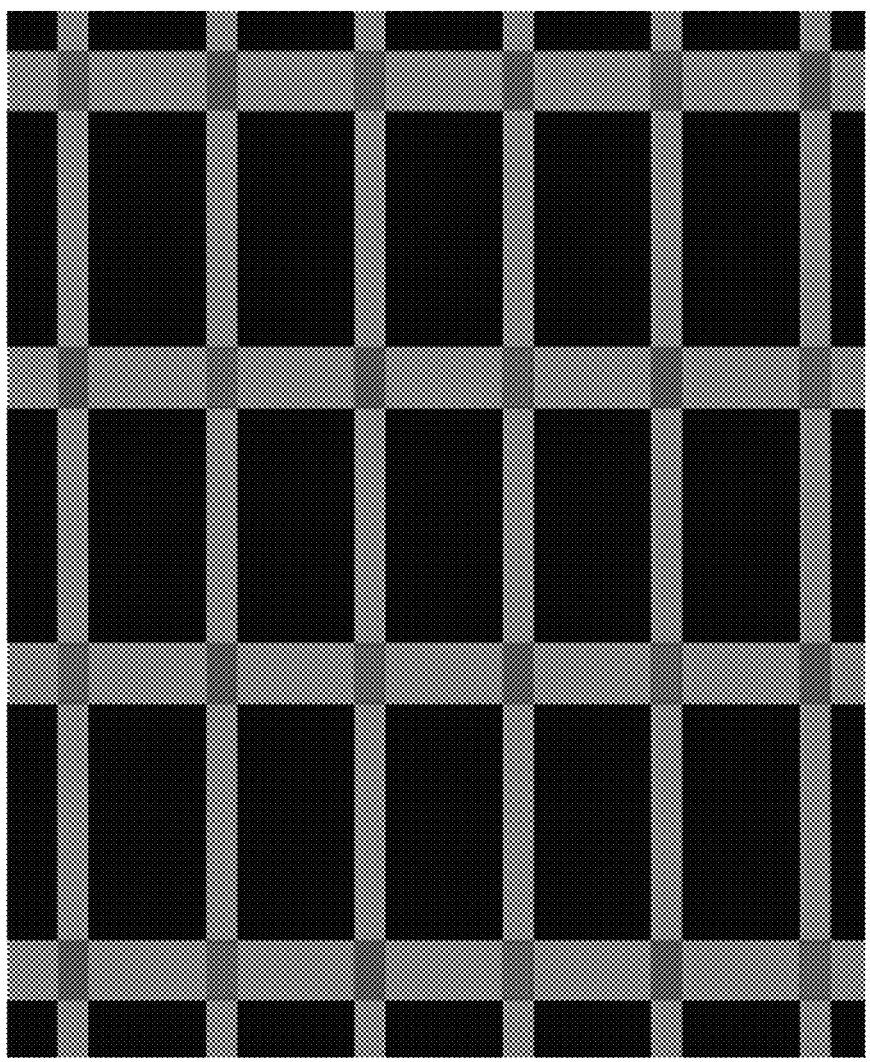
FIG. 2 is a schematic diagram of Metal1 and Metal2 metal wires in a PDN network in an embodiment of the present invention.

Considering that the toggle behaviors of the circuit are not evenly distributed in space, fragments with the same total toggle rate do not have the same toggle rate in each sub-region. When the total toggle rates are the same, an IR Drop value of an area with higher toggle concentration is larger. Therefore, a more detailed sub-region analysis is required. The current distribution matrix after the preliminary screening is divided into several sub-regions according to the positions of elements, and the toggle rate of each sub-region and the interactive influence among different sub-regions are calculated to perform more accurate screening of the VCD. The object of power supply integrity analysis is usually a horizontal and vertical staggered power distribution network as shown in FIG. 2. In FIG. 2, horizontal lines are metal wires at the lowest layer, and vertical lines are metal wires at the second layer from the lowest layer. Because underlying metal is closer to the functional elements of various designs, its current density is greater. Therefore, it is the focus of the power supply integrity analysis. Moreover, responses of different sub-regions to the same toggle excitation are in parallel, and a ratio of the response currents thereof is as follows:

$$\frac{I_{s,a}}{I_{s,b}} = \frac{R_{s,b}}{R_{s,a}} = \frac{d_{1,a} + \alpha \cdot d_{1,b}}{d_{2,a} + \alpha \cdot d_{2,b}}$$

Wherein, $I_{s,a}$ and $I_{s,b}$ represent response currents of an excitation of the sub-region s in the sub-region a and sub-region b; $R_{s,a}$ and $R_{s,b}$ represent resistance from the sub-region s to the sub-region a and sub-region b respectively; a horizontal distance from the sub-region s to the sub-region a is $d_{1,a}$, a longitudinal distance is $d_{2,a}$; a horizontal distance from the sub-region s to the sub-region b is $d_{1,b}$, a longitudinal distance is $d_{2,b}$; and a ratio of resistivity of the lowest metal layer to the second metal layer from the lowest metal layer is a.

Taking influence of the toggle on the sub-region where the toggle is located as a normalization standard, that is, assuming that $I_{s,s}$ is 1, calculating ratios among all the sub-regions so as to obtain the interactive influence among different sub-regions.

A specific process of performing time segment screening is as follows: calculating a response of the sub-region a to the toggle region according to the toggle rate $T_s$ of the sub-region s, and determining a corresponding screening criteria as follows:

$$\max_{a \in D} \left( \sum_{s \in S} (I_{s,a} \cdot T_s) \right) > \theta_f$$

Wherein $I_{s,a}$ represents a response current of the excitation of the sub-region s in the sub-region a; D represents all the sub-regions that need to be calculated, and S represents all the sub-regions that have the toggles at the current moment, $\theta_f$ represents a set fine screening threshold; and, as long as a maximum response value of the sub-region within the time segment is greater than the fine screening threshold, the time segment is retained, otherwise the time segment is removed. The selection of $\theta_f$ depends on the actual design and a desired screening rate, and generally 70% of the maximum toggle rate of all sub-regions for all time segments can be selected.

(4) Current Matrix Conversion

Re-outputting the fine screened current distribution matrix of step (3) as a VCD format file after vector compression. The function of this step is to re-output the screened current matrix as the VCD format file.

Specifically, when the fine screened current distribution models are spliced into a new VCD file, the length of each time segment should be slightly longer than the length of time used in the screening, so as to avoid the influence of tailing of a previous segment with a high toggle rate on the simulation results. When generating the new VCD file, the header information, the mapping information from the VCD node name to the design name, and the initial value information in the original VCD file should be made up.

The present invention utilizes the toggle rate feature to screen the VCD file successively in two stages, and can ensure the correct simulation results on the basis of significantly reducing the length of the test vector. In order to measure a degree of compression and an error between a compressed vector and an original vector, the present invention defines a compression ratio to measure the degree of compression, and a Global Error (GE) and a Regional Error (RE) to measure the error, which are specifically as follows:

$$\text{compression ratio} = \frac{\text{length of compressed sequence}}{\text{length of original sequence}}$$

-continued $$GE = \frac{|\max(IR_c) - \max(IR_r)|}{\max(IR_r)}$$

$$RE = \sum_{r \in R} \frac{GE_r}{|R|}$$

Wherein, max ($IR_c$) represents a maximum IR Drop value obtained by using compressed VCD for the simulation, and max ($IR_r$) represents a maximum IR Drop value obtained by using original VCD for the simulation. $GE_r$ represents a global error of a sub-region r, and R represents an entire region of the simulation circuit. RE is an average value of maximum IR Drop errors for all sub-regions.

Figure 3:
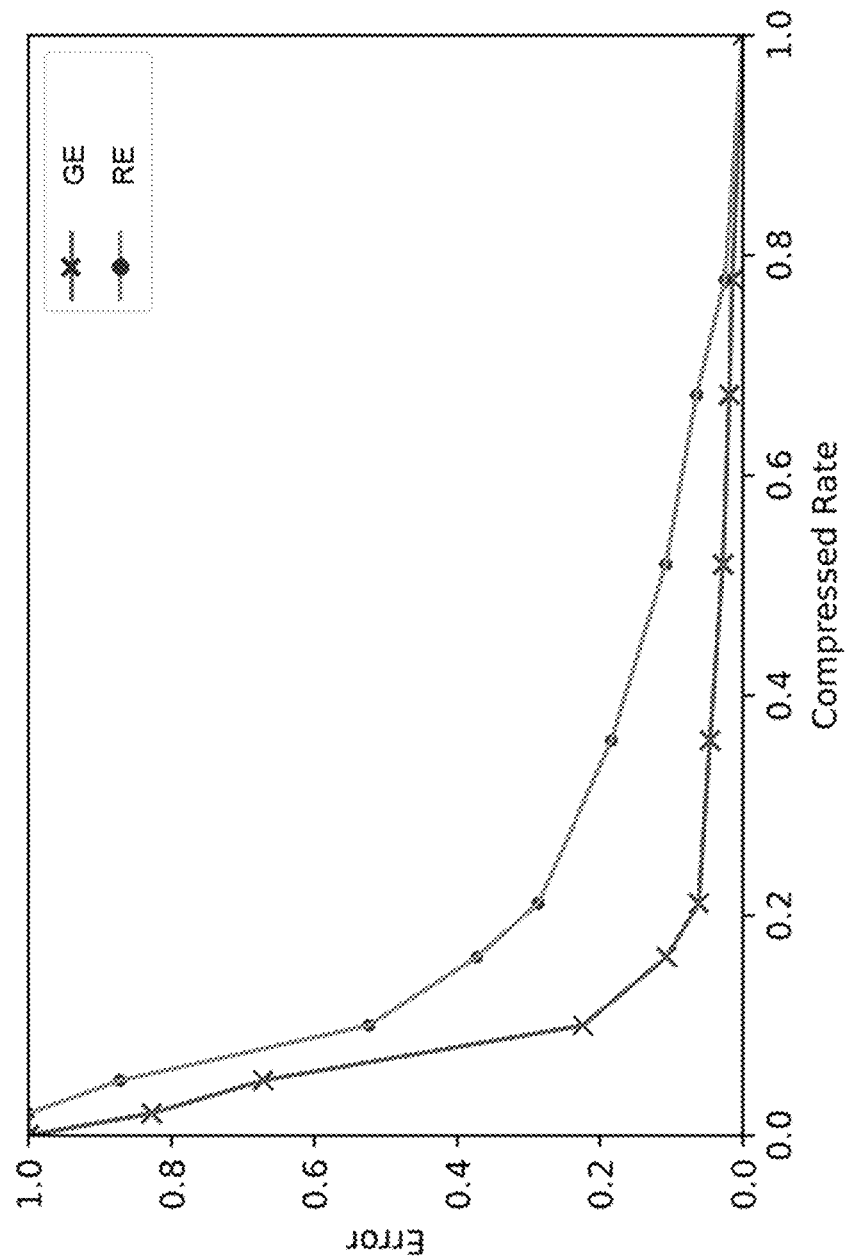
FIG. 3 is an error comparison diagram of simulation results of preliminary screening and an original vector in the present invention under a specific scenario.
Figure 4:
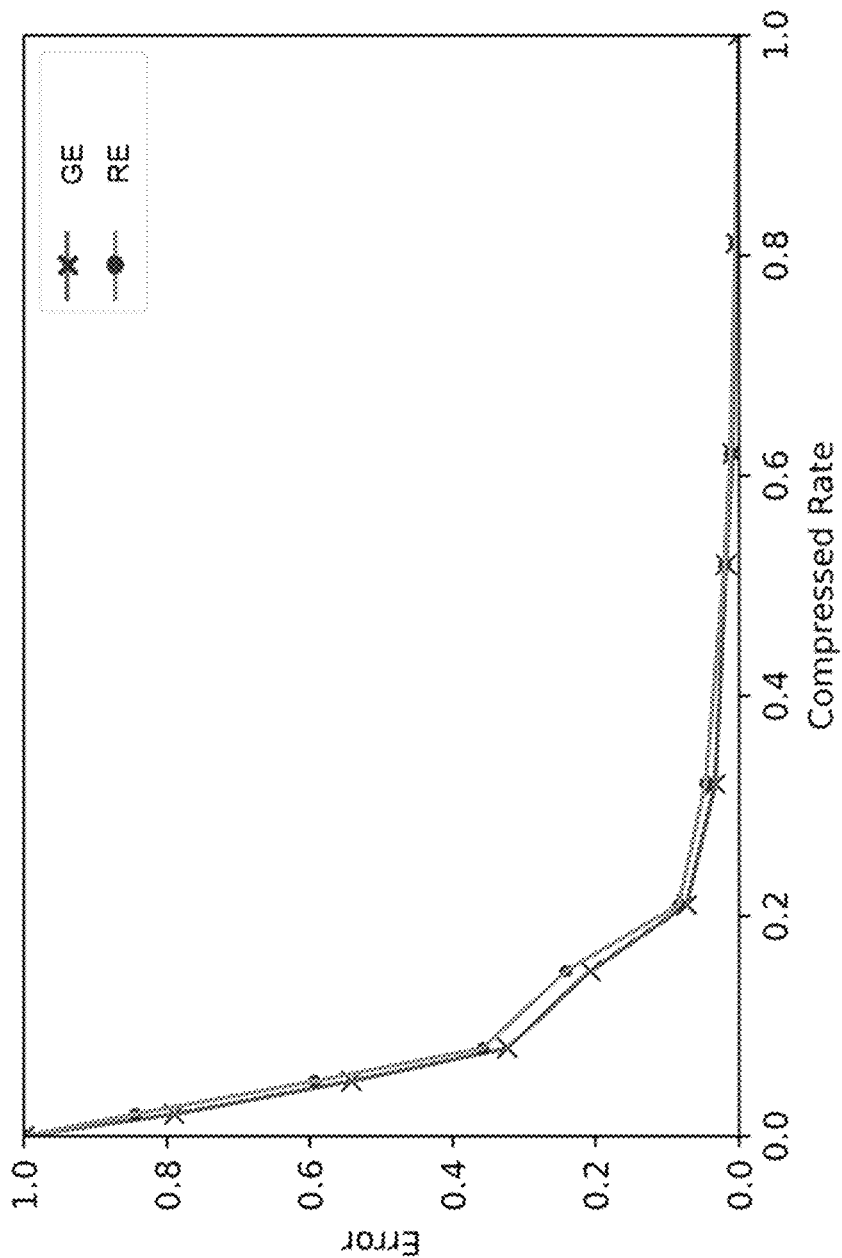
FIG. 4 is an error comparison diagram of simulation results of fine screening and an original vector in the present invention under a specific scenario.

As shown in FIG. 3, for a 3 mm×3 mm PDN instance, taking a 1000 ns VCD sequence as an input, a relative error is less than 5% when the preliminary screening compression ratio is higher than 0.7, and the relative error is less than 10% when the compression ratio is higher than 0.8. As shown in FIG. 4, for the fine screening stage, when the compression ratio is higher than 0.5, a fragment error after the algorithm screening is less than 3%.

Figure 5:
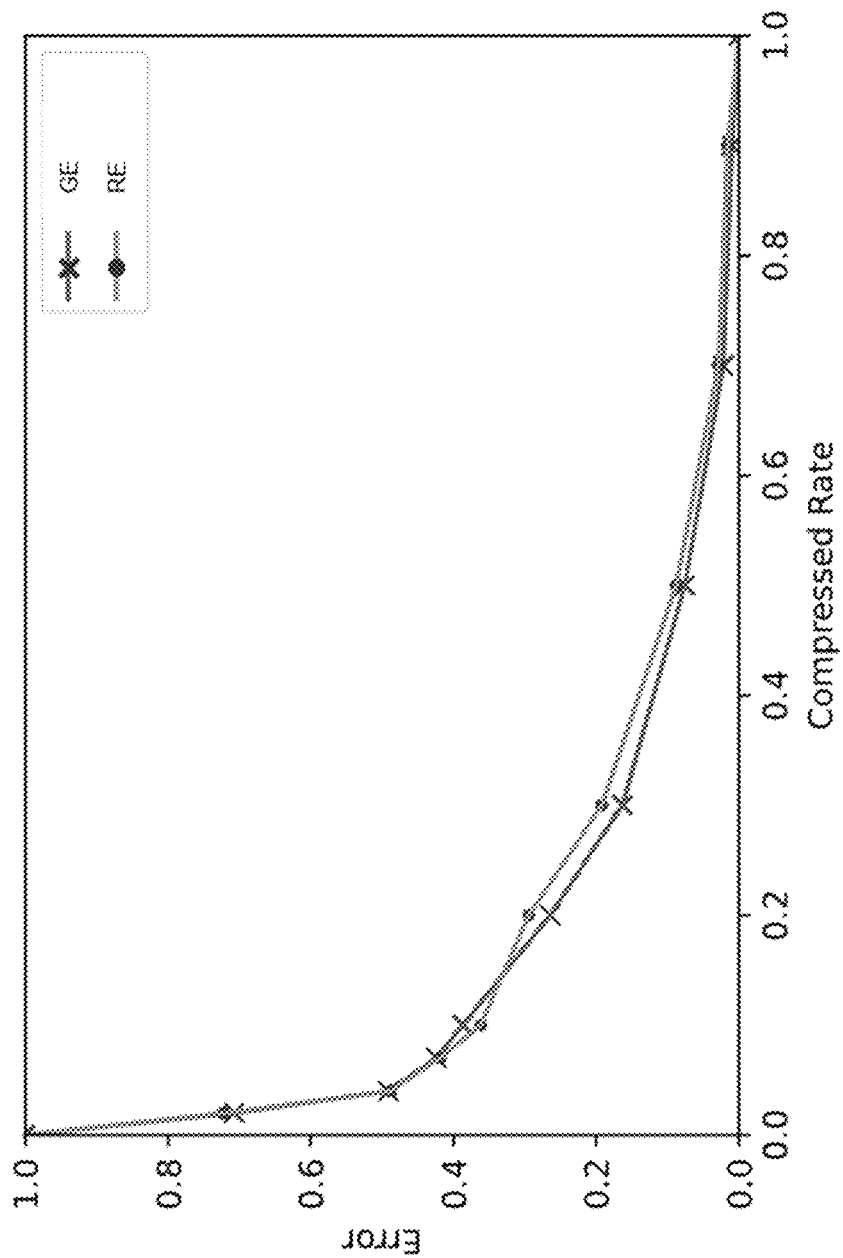
FIG. 5 is an error comparison diagram of simulation results of two-stage successive screening and an original vector in the present invention under a specific scenario.

In order to measure a cumulative error, the preliminary screening algorithm and the fine screening algorithm are cascaded, and the compression ratio of the preliminary screening is selected as 0.8 to ensure that useful fragments are not over-screened. The results are as shown in FIG. 5. When the compression ratio of fine compression is 0.5, the overall compression ratio is 0.4, and the relative error is less than 10%. The results show that the error of the two-stage compression algorithm is lower than that of the direct use of the fine compression algorithm; and thanks to the low computational complexity of the preliminary screening algorithm, the calculation speed is significantly faster than that of the direct use of the fine compression algorithm. In summary, a VCD vector compression method based on circuit toggle behaviors compresses a VCD test vector based on the toggle rate feature in two stages, which can quickly and accurately shorten the length of the transient simulation excitation vector, improve a simulation speed and shorten a design cycle.

Corresponding to the above embodiments of a VCD vector compression method based on circuit toggle behaviors, the present invention also provides embodiments of a VCD vector compression device based on circuit toggle behaviors.

Figure 6:
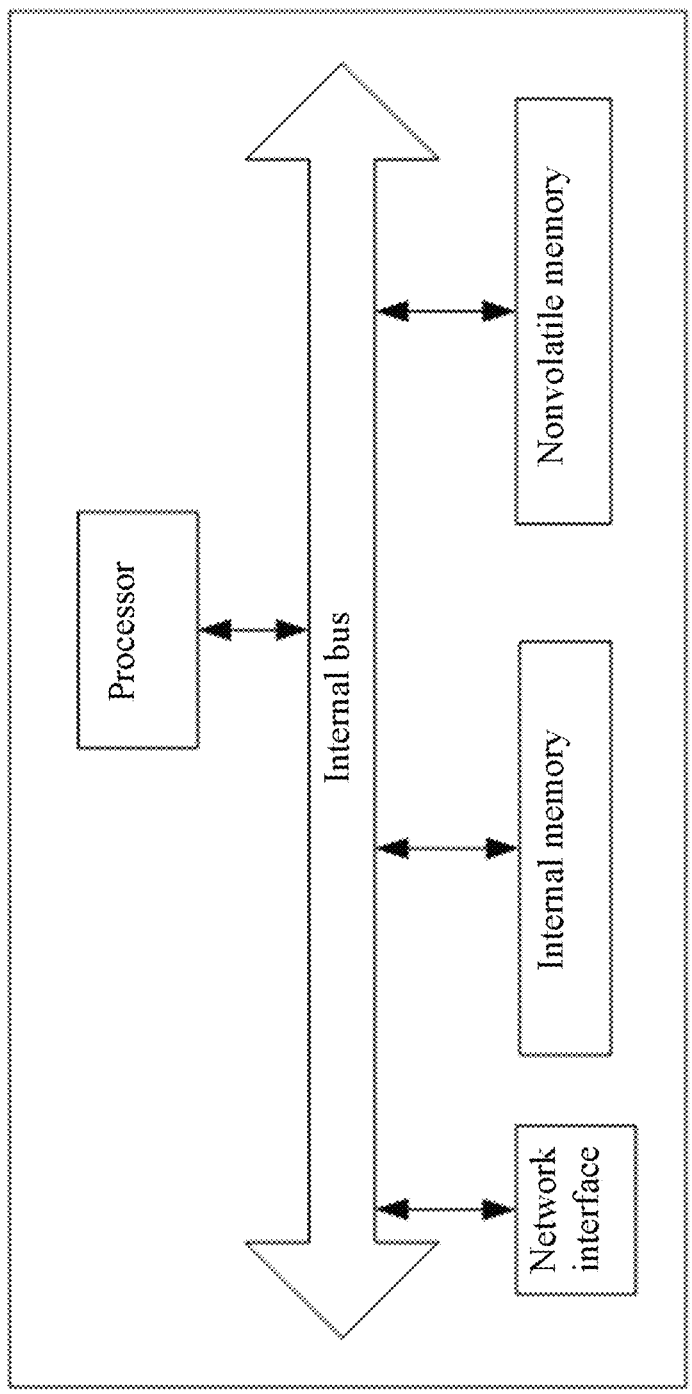
FIG. 6 is a structure diagram of a VCD vector compression device based on circuit toggle behaviors in the present invention.

Refer to FIG. 6, provided in an embodiment of the present invention is a VCD vector compression device based on circuit toggle behaviors, wherein the VCD vector compression device comprises one or more processors and a memory in which executable codes are stored, wherein the processor executes the executable codes in order to realize the VCD vector compression method based on circuit toggle behaviors as described in the above embodiments.

Embodiments of the VCD vector compression device based on circuit toggle behaviors in the present invention can be applied to any apparatus with data processing capability, which may be an apparatus or device such as a computer. Device embodiments can be realized by a software, or by a hardware or a combination of hardware and software. Taking software implementation as an example, as a logical device, it is formed by reading corresponding computer program instructions in a non-volatile memory into an internal memory through a processor of any apparatus with data processing capability wherein the device locates. From a hardware level, as shown in FIG. 6, it is a hardware structure diagram of any apparatus with the data processing capability where the VCD vector compression device based on circuit toggle behaviors locates of the present invention. In addition to a processor, an internal memory, a network interface and a non-volatile memory shown in FIG. 6, any apparatus with the data processing capability where the device locates in the embodiment may further comprise other hardware according to an actual function of the apparatus with the data processing capability.

A realization process of a function and a role of each unit in the above device is detailed in a realization process of the corresponding step in the above method, and will not be repeated here.

For the device embodiments, since they basically correspond to the method embodiments, refer to the partial description of method embodiments for relevant contents. The device embodiments described above are schematic only, where the units described as separate components may or may not be physically separated, and components shown as units may or may not be physical units, that is, they may be located in one place, or may be distributed over a plurality of network units. Part or all of the modules can be selected according to the actual needs to realize the purpose of the solution of the present invention. It can be understood and implemented without creative effort for a person skilled in the art.

The embodiment of the present invention also provides a computer readable storage medium on which a program is stored. When the program is executed by a processor, the VCD vector compression method based on circuit toggle behaviors in the above embodiments is realized.

The computer readable storage medium may be an internal storage unit of any apparatus with the data processing capability described in any one of the preceding embodiments, such as a hard disk or an internal memory. The computer readable storage medium may also be an external storage apparatus of any apparatus with the data processing capability, such as a plug-in hard disk, a Smart Media Card (SMC), an SD Card, a Flash Card equipped with the apparatus. Further, the computer readable storage medium may also comprise both the internal storage unit of any device with the data processing capability and an external storage device. The computer readable storage medium is used to store the computer program and other programs and data required by the apparatus with the data processing capability, and can also be used to temporarily store data that has been output or will be output.

The beneficial effects of the present invention are as follows:

The present invention utilizes the toggle rate feature to screen the VCD file successively in two stages, and can ensure the correct simulation results on the basis of significantly reducing the length of the test vector. For a typical pull-down network (PDN) power consumption simulation example, the method can screen out 60% of VCD vector segments while keeping the relative error within 10%. This method can shorten the length of transient simulation excitation vector quickly and accurately, improve the simulation speed and shorten the design cycle.

This method utilizes the toggle rates of VCD vector at different moments to screen the VCD fragments, which is of great significance for shortening the power supply integrity simulation in the integrated circuit design.

The above embodiments are used to explain the present invention, but not to limit the present invention, and any modification or change made to the present invention within the spirit of the present invention and the protection scope of the claims shall fall within the protection scope of the present invention.

What is claimed is:

1. A Value Change Dump (VCD) vector compression method based on circuit toggle behaviors, the method comprising the following steps:
    (1) converting a VCD format file into a three-dimensional current matrix, wherein three dimensions of a current matrix model are one time dimension and two spatial dimensions;
    (2) performing preliminary screening based on an overall toggle feature: according to the current matrix obtained in step (1), dividing the current matrix into several time segments in accordance with an equal interval in the time dimension, and performing screening according to the overall toggle feature, and forming a preliminary screened current distribution matrix by the screened time segments;
    (3) performing fine screening based on region toggle features: according to the preliminary screened current distribution matrix, re-dividing the preliminary screened current distribution matrix into several time segments in accordance with an equal interval in the time dimension, and performing further screening according to local toggle features, and forming a fine screened current distribution matrix by the screened time segments, wherein the local toggle features are obtained by dividing the preliminary screened current distribution matrix into several sub-regions according to element positions, and calculating a toggle rate of each sub-region and interactive influence among different sub-regions; and
    (4) re-outputting the fine screened current distribution matrix of step (3) as a VCD format file after vector compression.

2. The VCD vector compression method based on circuit toggle behaviors according to claim 1, wherein in step (1), a specific process of converting a VCD format file into a three-dimensional current matrix model is as follows: corresponding a toggle recorded in the VCD file to pins of a specific device, and then obtaining a device position through a Design Exchange Format (DEF) file to locate the toggle to a specific position, which corresponds to the two spatial dimensions of the current matrix; and determining initial time according to toggle timing recorded in the VCD file, and determining specific current changes with time according to a mapping of the toggle to a current, which corresponds to the time dimension of the current matrix.

3. The VCD vector compression method based on circuit toggle behaviors according to claim 2, wherein the mapping of the toggle to the current is a toggle waveform recorded in an Apache Power Libraries (APL) format file, or a current estimated from power consumption in a library file (lib) file.

4. The VCD vector compression method based on circuit toggle behaviors according to claim 1, wherein in step (1), converting a device toggle vector recorded in the VCD format file into a three-dimensional current distribution matrix; and recording the toggle behaviors in a matrix form to generate a sparse matrix, and recording the three-dimensional sparse matrix in a dictionary form.

5. The VCD vector compression method based on circuit toggle behaviors according to claim 1, wherein step (2) is specifically as follows: for the current matrix model obtained in step (1), obtaining the toggle rate of each time segment according to the following formula:

$$\text{ToggleRate} = \frac{N_{total}}{\tau}$$

wherein τ is the length of the time segment, and $N_{total}$ is a total number of toggles of the element during this period; and setting a preliminary screening threshold $\theta_c$, retaining a segment with a toggle rate higher than $\theta_c$, and removing a segment with a toggle rate lower than a threshold.

6. The VCD vector compression method based on circuit toggle behaviors according to claim 1, wherein in step (2), the overall toggle feature is obtained by calculating a toggle rate of a circuit element within each time segment and screening out a time segment with a toggle rate larger than a preliminary screening threshold.

7. The VCD vector compression method based on circuit toggle behaviors according to claim 1, wherein a specific process of calculating interactive influence among different sub-regions is as follows: determining a parallel relationship for response sub-regions of the same toggle excitation; assuming that a lowest metal layer is horizontally arranged and a second metal layer from the lowest metal layer is vertically arranged, determining a ratio of response current thereof as follows:

$$\frac{I_{s,a}}{I_{s,b}} = \frac{R_{s,b}}{R_{s,a}} = \frac{d_{1,a} + \alpha \cdot d_{1,b}}{d_{2,a} + \alpha \cdot d_{2,b}}$$

wherein, $I_{s,a}$ and $I_{s,b}$ represent response currents of an excitation of the sub-region s in the sub-region a and sub-region b; $R_{s,a}$ and $R_{s,b}$ represent resistance from the sub-region s to the sub-region a and sub-region b respectively; a horizontal distance from the sub-region s to the sub-region a is $d_{1,a}$, a longitudinal distance is $d_{2,a}$; a horizontal distance from the sub-region s to the sub-region b is $d_{1,b}$, a longitudinal distance is $d_{2,b}$; and a ratio of resistivity of the lowest metal layer to the second metal layer from the lowest metal layer is a; and taking influence of the toggle on the sub-region where the toggle is located as a normalization standard, that is, assuming that $I_{s,s}$ is 1, calculating ratios among all the sub-regions so as to obtain the interactive influence among different sub-regions;

a specific process of performing time segment screening is as follows: calculating a response of the sub-region a to the toggle region according to the toggle rate $T_S$ of the sub-region s, and determining a corresponding screening criteria as follows:

$$\max_{a \in D} \left( \sum_{s \in S} (I_{s,a} \cdot T_s) \right) > \theta_f$$

wherein $I_{s,a}$ represents a response current of the excitation of the sub-region s in the sub-region a; D represents all the sub-regions that need to be calculated, and S represents all the sub-regions that have the toggles at the current moment, $\theta_f$ represents a set fine screening threshold; and, as long as a maximum response value of the sub-region within the time segment is greater than the fine screening threshold, the time segment is retained, otherwise the time segment is removed.

8. The VCD vector compression method based on circuit toggle behaviors according to claim 1, wherein step (4) is specifically as follows: when the fine screened current distribution matrices of step (3) are spliced into a new VCD file, determining that the length of each time segment should be above 10% of the length of the time segment used in screening, so as to avoid the influence of tailing of a previous time segment on simulation results; and when generating the new VCD file, making up header information, mapping information from a VCD node name to a design name, and initial value information in the original VCD file.

9. A VCD vector compression device based on circuit toggle behaviors, the VCD vector compression device comprising a memory stored with an executable code, and one or more processors, wherein the processor executes the executable code in order to fulfill the steps of the VCD vector compression method based on the circuit toggle behaviors according to claim 1.

10. A computer readable storage medium configured for storing one or more computer programs, wherein the one or more computer programs include a program code, the program code, when the computer program is run on a computer, is used for performing the VCD vector compression method based on the circuit toggle behaviors according to claim 1.

* * * * *